United States Patent [19]

Hill et al.

[11] 4,141,779

[45] Feb. 27, 1979

[54] METHOD AND APPARATUS FOR AVOIDING UNDESIRABLE DEPOSITS IN CRYSTAL GROWING OPERATIONS

[75] Inventors: David W. Hill; Lewis E. Katz, both of Allentown; Robert J. Lavigna, Bath; Raymond E. Reusser, Bethlehem, all of Pa.

[73] Assignees: Western Electric Company, Inc.; Bell Telephone Laboratories, Incorporated, both of New York, N.Y.

[21] Appl. No.: 905,267

[22] Filed: May 12, 1978

Related U.S. Application Data

[63] Continuation of Ser. No. 750,932, abandoned.

[51] Int. Cl.² .............................................. B01J 17/18
[52] U.S. Cl. ................................ 156/617 SP; 422/249
[58] Field of Search ......... 156/617 SP, 617 R, 617 H, 156/619, 606, DIG. 64; 23/273 SP; 923/348; 134/21, 37, 22 R, 104, 137, 145, 151, 157, 198

[56] References Cited

U.S. PATENT DOCUMENTS

| | | | |
|---|---|---|---|
| 3,353,914 | 11/1967 | Pickar | 23/208 |
| 4,036,595 | 7/1977 | Lorenzini | 156/617 SP |

OTHER PUBLICATIONS

Chartier et al., Solid State Technology, Feb. 1975, pp. 31-33.

*Primary Examiner*—Hiram H. Bernstein
*Attorney, Agent, or Firm*—Robert Y. Peters

[57] ABSTRACT

In Czochralski crystal growing operations, particularly those involving growth of silicon crystals, projecting formations of silicon monoxide sometimes form on the surface of the melt-containing crucible just above the initial level of the melt. These formations are avoided by perturbing chemical formation conditions at the region of probable formation. Such perturbations may be provided by a tube through which either a positive pressure of a gas, such as argon, is directed toward the region of probable formation or through which a negative pressure may be applied to perturb the formation conditions.

10 Claims, 1 Drawing Figure

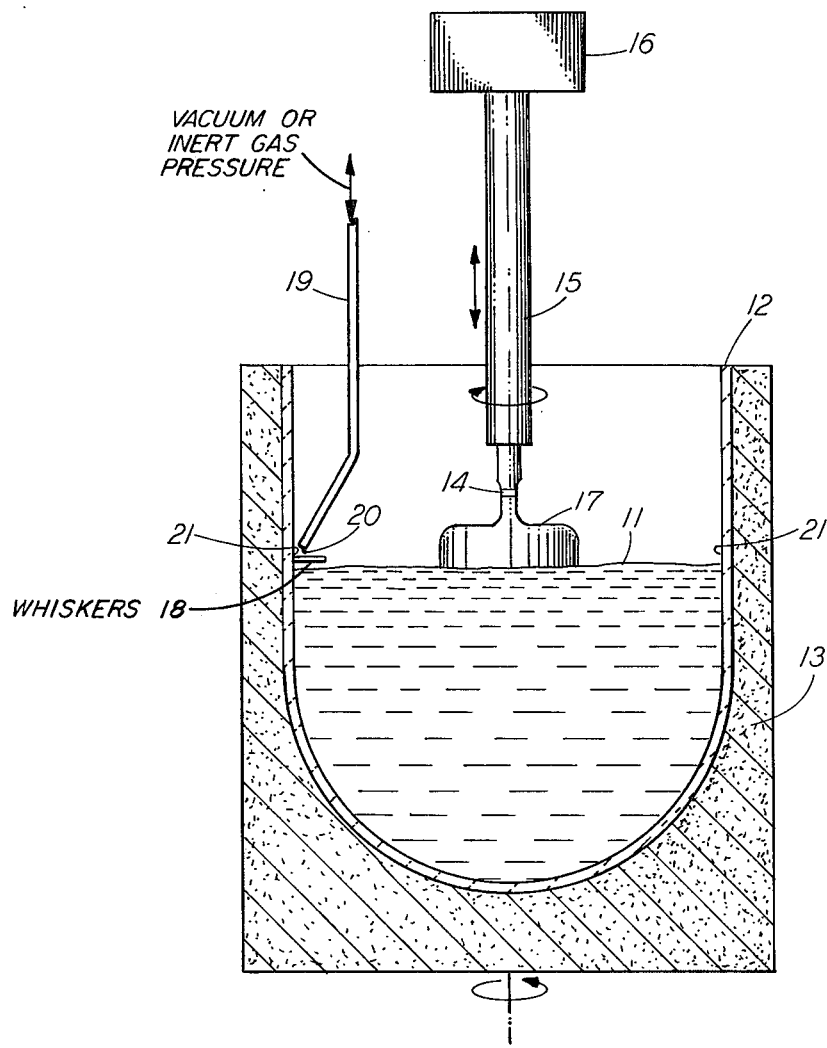

METHOD AND APPARATUS FOR AVOIDING UNDESIRABLE DEPOSITS IN CRYSTAL GROWING OPERATIONS

This is a continuation of application Ser. No. 750,932 filed Dec. 15, 1976 and now abandoned.

BACKGROUND OF THE INVENTION

1. Field of the Invention

This invention relates to methods and apparatus for avoiding undesirable growths, deposits and other formations in crystal growing operations; and, more particularly, to methods and apparatus for avoiding formation of projecting whiskers of silicon monoxide on the inner walls of a melt-containing crucible in Czochralski crystal growing operations.

It is conventional to provide single crystalline forms of many solid materials by preparing a melt of the material and contacting the surface of the melt with a previously prepared seed crystal of the material of the desired crystalline lattice orientation. The seed crystal is withdrawn from the melt at a rate of the order of a few inches an hour while the crystal and the melt are counter-rotated with respect to each other.

Typically, the chamber in which the crystal is grown is first partially evacuated and then backfilled to a positive pressure with a continuing flow of a gas, such as argon, which serves as the ambient during the crystal growth. The positive pressure aids in avoiding entrance of undesired contaminants into the system during the growth. With this described technique, commonly termed the Czochralski technique, crystals several feet in length and several inches in diameter are routinely grown by workers in the silicon semiconductor technologies.

Particularly in the silicon semiconductor technologies, the melt, which may be at an average temperature of 1420° Centigrade, typically is contained in a quartz (silicon dioxide) crucible. At the temperature involved, reaction of the quartz crucible with the molten material occurs, and thus provides a source of oxygen, which in turn reacts with the molten silicon to produce silicon monoxide. The silicon monoxide is given off in vapor form from the melt and tends to preferentially grow, condense, or otherwise form dendrites, i.e., projecting formations, on what are apparently nucleation sites on the inner wall of the crucible just above the initial level of the melt surface during growth of the crystal.

These dendrites extend radially inward from the inner wall of the crucible, and often become dislodged and drop into the melt, where convection currents or other flow patterns carry them to the growing crystal. Upon impact with the growing crystal, the desired crystalline structure usually is lost and any further growth would produce undesirable material.

2. Description of the Prior Art

To alleviate the problems associated with silicon monoxide dendrites and other formations, a disclosure in an article entitled "Czochralski Silicon Crystal Growth at Reduced Pressures" by C. T. Chartier et al., in *State Technology*, 1975, pages 31–33, suggests growing crystals by the Czochralski technique in a vacuum, and alleges that significantly improved results are obtained. This vacuum technique is in strong contradistinction to the above-described conventional techniques for Czochralski growth, wherein the crystal growing chamber is purged with a positive pressure of a gas, such as argon, during the crystal growing process.

A distinct advantage of using a positive pressure of a gas is that it tends to minimize any likelihood of contamination entering the system during the time that it is under positive pressure. A related advantage from an operating viewpoint is that with a positive pressure system, a port in the system can be opened during the growth cycle, if desired for any of a variety of reasons, without incurring significant entrance of contaminants into the system.

These advantages of the positive pressure technique suggest a disadvantage of the vacuum technique, namely that entrance of contamination while the system is under vacuum, is rendered more likely in the event that any leak in the system should develop. A further apparent problem with the vacuum technique is the significantly more complex equipment required to perform the Czochralski process under vacuum. Still a further apparent potential problem with the vacuum technique is the possible adverse effects of the absence of the flowing gas upon the heat transfer dynamics of a Czochralski-type system.

SUMMARY OF THE INVENTION

In view of the aforementioned and other problems inherent in conventional methods and apparatus for growing single crystalline material, it is an object of this invention to provide new and improved methods and apparatus for avoiding growths, deposits, or other formations of undesirable materials in a crystal grower during a crystal growing cycle.

The aforementioned and other objects are achieved in accordance with this invention by providing expedients to perturb the chemical formation conditions at the region of probable formation. Such expedients may include a tube through which a positive pressure of a gas, such as argon, is directed toward the region of probable formation. Alternatively, a negative pressure, i.e., a vacuum, may be applied through the tube to otherwise perturb the chemical formation conditions at the region of probable formation.

DESCRIPTION OF THE DRAWING

The aforementioned and other features, characteristics, and advantages, and the invention in general will be better understood from the following, more detailed description taken in conjunction with the accompanying drawing in which:

The drawing illustrates a portion of a crystal grower including a melt and including an expedient in accordance with one embodiment of this invention for perturbing the chemical formation conditions at a portion of an inner wall of a melt-containing crucible.

DETAILED DESCRIPTION

For simplicity and clarity of explanation, the invention will be described hereinafter principally in connection with a Czochralski-type crystal grower adapted for producing a silicon crystal from a silicon melt which may, but need not, be doped with an impurity for determining the conductivity type and resistivity of the grown crystal. However, it is to be understood that the invention is not so limited, but rather is applicable to other types of processes and apparatus for growing crystals, wherein avoidance of undesirable formations within the crystal growing apparatus is desired.

With reference now to the drawing there is shown in cross-sectional view, a quantity of molten silicon 11, termed a "melt," confined in a quartz crucible 12. Crucible 12 is surrounded and supported by a thermally conductive black body housing 13.

Housing 13 typically is of graphite, and in the art, is typically termed as "susceptor" for historical reasons. In early crystal growers, heating was provided primarily by radio frequency heating; and the housing 13 operated as a susceptor to convert the radio frequency energy into thermal energy. However, with the use of larger masses of molten material as the art progressed, radio frequency heating was largely supplanted by thermal resistance, radiative-type heating. Conventional heating arrangements, including thermal resistance heating, may be used with this invention.

In operation, a seed crystal 14 is held on the end of a seed shaft 15, which in turn is supported by a mechanism 16, capable of rotating shaft 15 and moving shaft 15 vertically. The free end of the seed 14 is touched to the surface of the molten material 11 while the crucible and the seed shaft 15 are counter-rotated, i.e., in opposite directions.

After the seed crystal 14 is touched to the surface of the molten material 11, and provided that temperature and other conditions known to those in the art are proper, the molten material solidifies on the seed crystal with the same lattice orientation as the seed crystal. By slowly withdrawing the seed crystal, typically at a rate of the order of a few inches an hour, and rotating the seed shaft 15, a single crystalline ingot 17 is formed from the molten material.

Operation of at least one type of Czochralski crystal grower is described in U.S. Pat. No. 3,679,370, issued July 25, 1972, to J. J. Czeck et al., and further details of operation may be found in U.S. Pat. No. 3,698,872, issued Oct. 17, 1972, to R. E. Reusser, both indicated patents being assigned to the assignee hereof.

As mentioned briefly hereinabove, in operation it is not uncommon to have projecting formations 18, commonly termed "whiskers," of silicon monoxide forming on the inner surface of the crucible 12 just above the initial level of the melt during the crystal growth cycle. These whiskers are a problem when they become detached from the crucible. They travel through the melt due to convection currents and other flow patterns in the melt to the solid-liquid interface at the growing crystal 17, where they can destroy the desired single crystal structure and render any further crystal growth fruitless.

In accordance with one embodiment of this invention, formation of whiskers 18 is avoided by perturbing the chemical formation conditions at the region of probable formation. To this end, a tube 19, for example of quartz, is positioned with an outlet 20 directed toward the region of probable growth.

In accordance with one embodiment of this invention, a positive pressure of a gas, such as argon, is directed through tube 19 and out orifice 20 toward the region 21 of probable formation. The ambient perturbation caused by the locally greater flow of gas has been found to significantly reduce and, in fact, to effectively eliminate the formation of whiskers 18 in Czochralski crystal growing operations.

More specifically, in a chamber having a normal flow of highly pure argon purging gas at 150 cubic feet per hour, it has been demonstrated that with a five to ten cubic feet per hour flow of argon through a ¼ inch internal diameter tube 19 disposed at an angle of 30° to 45° off the vertical and about ½ inch above the melt surface and ½ inch from the inner wall of crucible 12, no silicon monoxide whiskers were formed. This complete absence of detectable whisker formation was obtained despite a deliberate imposition upon the system of conditions which normally have tended to produce whisker formations. Such conditions include: purposely letting the melt sit in growth position for as much as 45 minutes before initiating crystal growth; and increasing system temperature to "melt back" part of a grown crystal and then lowering the temperature and initiating regrowth of the crystal.

In accordance with a second and alternative embodiment of this invention, a negative pressure, i.e., a vacuum, may be applied through tube 19 to analogously otherwise disturb the formation conditions at region 21 of probable formation. For example, using a tube 19 of approximately ¼ inch internal diameter disposed about ½ inch from the inner wall of crucible 12, a mechanical vacuum pump (not shown) was used to establish an exhaust throughput of about 20 cubic feet per hour through tube 19 in a system purged with about 150 cubic feet per hour of argon. No detectable growth of whiskers was observed.

It should be noted that as a result of the crucible 12 being rotated, the perturbation caused by tube 19, which is assumed to be stationary, is effective to perturb the chemical growth conditions of an annular portion 21 around the crucible. Of course, if greater or more widespread perturbation is needed in any particular application, element 19 need not be simply a single, small diameter tube. Rather, element 19 may include a plurality of tubes directed at a plurality of regions along the inner wall of crucible 12. Alternatively, of course, element 19 may be a manifold arrangement for accomplishing wide-angle dispersion of the perturbation, if desired.

At this point, it is believed the principles of this invention have been described in sufficient detail to enable one skilled in the art to practice the invention. Although the invention has been described in part by making detailed reference to specific embodiments, such detail is intended to be and will be understood to be instructive rather than restrictive. It will be appreciated by those skilled in the art that many variations can be made in the structure and in the modes of operation without departing from the spirit and the scope of the invention as disclosed in the foregoing teachings.

For example, it will be apparent that the tube 19 and other materials need not be quartz, but may be of any suitable material capable of withstanding the temperatures involved, provided of course that such material does not provide deleteriously contaminating impurities into the system.

Further, it will be apparent that gases other than argon can be used for general system purging and for perturbing the formation conditions through tube 19. Other suitable gases include, without limitation, hydrogen, helium, and mixtures involving argon, hydrogen, and/or helium.

Still further, of course, the general system purge gas, e.g., a mixture of argon and hydrogen, need not be the same as the perturbing gas, e.g., pure argon, supplied through tube 19.

What is claimed is:

1. Apparatus for growing crystalline material from a melt comprising:

a crucible for containing a material for making the melt;

means for producing ambient conditions above the melt;

means for heating a given quantity of material in the crucible to a temperature at which it melts;

means for supporting a crystalline body of the material with respect to the melt; and means, separate from the ambient conditions' producing means and located adjacent to a specific portion of the crucible where undesirable material tends to form, for selectively intensifying perturbation of the ambient conditions at such specific portion which is located above the surface of the melt, sufficiently intense to prevent undesirable formation of material thereupon.

2. Apparatus as recited in claim 1, wherein the perturbing means include means for supplying a positive pressure of a gas to the portion of the inner wall of the crucible.

3. Apparatus as recited in claim 2, further comprising means for supporting the crucible including means for rotating the crucible; wherein the ambient conditions' producing means establishes an environment of positive pressure with respect to atmospheric pressure; and wherein the supplying means includes an immobile tube, the opening of which is adjacent to the portion of the inner wall of the crucible, and through which the gas is directed upon said portion as the crucible is rotated.

4. Apparatus as recited in claim 1, wherein the perturbing means includes means for supplying a negative pressure to the portion of the inner wall of the crucible.

5. Apparatus as recited in claim 4, further comprising means for supporting the crucible, said supporting means including means for rotating the crucible; wherein the supplying means includes an immobile tube directed upon the portion of the inner wall of the crucible as the crucible is rotated and through which a negative pressure is drawn.

6. A method of growing crystalline material from a melt comprising:

heating a quantity of a material in a crucible to a temperature at which it melts;

producing ambient conditions above the melt;

withdrawing and supporting a crystalline body of material with respect to the melt; and selectively intensifying perturbation of the ambient conditions with a means separate from the means that produces such conditions, the intensifying of perturbation occurring at a specific portion of the inner wall of the crucible where undesired material tends to form, which portion is located above the surface of the melt, sufficiently intense to prevent undesirable formations of material thereupon.

7. A method as recited in claim 6, wherein the perturbing step includes directing a positive pressure of a gas upon a portion of the inner wall of the crucible above the level of the melt surface.

8. A method as recited in claim 7, comprising the further steps of maintaining the ambient conditions above the melt at a positive pressure with respect to atmospheric pressure, and of rotating the crucible with respect to the stream of gas so that the gas is effective upon an annular portion of the wall of the crucible.

9. A method as recited in claim 6, wherein the perturbing step includes providing a negative pressure to a portion of the inner wall of the crucible.

10. A method as recited in claim 9, wherein the crucible is rotated with respect to the negative pressure so that the negative pressure is effective upon an annular portion of the inner wall.

* * * * *